(12) United States Patent
Choi

(10) Patent No.: US 7,500,564 B2
(45) Date of Patent: Mar. 10, 2009

(54) WAFER CARRYING APPARATUS

(75) Inventor: Jong Sok Choi, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 479 days.

(21) Appl. No.: 11/205,541

(22) Filed: Aug. 16, 2005

(65) Prior Publication Data

US 2006/0099058 A1 May 11, 2006

(30) Foreign Application Priority Data

Aug. 16, 2004 (KR) ............... 10-2004-0064295

(51) Int. Cl.
*B65D 85/30* (2006.01)

(52) U.S. Cl. .............. 206/711; 206/454; 211/41.18; 220/768

(58) Field of Classification Search .......... 206/454, 206/710, 711, 722, 723, 832; 211/41.18; 118/500; 414/936, 941, 416.08, 800; 220/752, 220/757, 762, 768
See application file for complete search history.

(56) References Cited

U.S. PATENT DOCUMENTS

| | | | | |
|---|---|---|---|---|
| 4,228,902 | A | * | 10/1980 | Schulte ............... 211/41.18 |
| 5,638,958 | A | * | 6/1997 | Sanchez ............... 206/710 |
| 5,960,959 | A | * | 10/1999 | Wu et al. ............... 206/710 |
| 6,615,994 | B2 | * | 9/2003 | Cu, Jr. ............... 211/41.18 |
| 2003/0010673 | A1 | * | 1/2003 | Duban-Hu et al. ...... 206/711 |
| 2004/0108284 | A1 | * | 6/2004 | Huang et al. ............... 211/41.18 |

FOREIGN PATENT DOCUMENTS

| | | |
|---|---|---|
| JP | 55164877 U | 11/1980 |
| JP | 62177640 U | 11/1987 |
| JP | 6484633 A | 3/1989 |
| JP | 1313955 A | 12/1989 |
| JP | 572789 A | 3/1993 |
| JP | 9290890 A | 11/1997 |
| JP | 10340949 A | 12/1998 |
| JP | 2000100921 A | 4/2000 |
| JP | 2001102394 A | 4/2001 |
| JP | 200264136 A | 2/2002 |

OTHER PUBLICATIONS

Japanese Office Action; Application No. 2005-234778; Dated: Aug. 20, 2007; Japanese Patent Office; Japan.

(Continued)

*Primary Examiner*—Luan K Bui
(74) *Attorney, Agent, or Firm*—Andrew D. Fortney

(57) ABSTRACT

A wafer carrying apparatus or cassette is disclosed, which includes a binding or retention unit, so as to prevent wafers from being damaged by crash, inadvertent egress or exiting, and so on. The wafer carrying apparatus includes a main body provided with a plurality of wafer insertion grooves formed on inner sides and an opening formed on a front surface to take wafers in and out, a binding unit configured to move up and down on the front surface of the main body, its position relative to the insertion grooves being variable so as to close and open the insertion grooves, and a mechanism for varying the position of the binding unit relative to the insertion grooves, the mechanism being connected to the binding unit.

21 Claims, 8 Drawing Sheets

OTHER PUBLICATIONS

HIROO, Sato; Semiconductor Substrate Carrier and Manufacturing Semiconductor Device; Patent Abstracts of Japan; Publication No. 2000100921 A; Publication Date: Apr. 7, 2000; Japanese Patent Office; Japan.

Shuji, Akiyama and Seiji, Nejito; Carrier; Patent Abstracts of Japan; Publication No. 01313955 A; Publication Date: Dec. 19, 1989; Japanese Patent Office; Japan.

Masakatsu, Itoigawa; Transfer Cassette for Substrates; Patent Abstracts of Japan; Publication No. 10340949 A; Publication Date: Dec. 22, 1998; Japanese Patent Office; Japan.

Yuuki, Yoshikawa and Masamitsu, Yanagihara; Wafer Carrier; Patent Abstracts of Japan; Publication No. 09290890 A; Publication Date: Nov. 11, 1997; Japanese Patent Office; Japan.

Hitachi, Ltd.; Englsh Translation of a Claim; Application No. S54-64220; Application Date: May 16, 1979; Japan; Corresponds to Japanese Publication No. 55-164877 U.

NEC Home Electronics, Ltd.; Engilsh Translation of a Claim; Application No. S61-65755; Application Date: Apr. 30, 1986; Japan; Corresponds to Publication No. 62-177640 U.

Tomoyuki, Terajima; Wafer Storing Jig; Patent Abstracts of Japan; Publication No. 64-084633; Publication Date: Mar. 29, 1989; Japanese Patent Office; Japan.

Tadahiro, Nakamichi; Carrier; Patent Abstracts of Japan; Publication No. 2001-102394; Publication Date: Apr. 13, 2001; Japanese Patent Office; Japan.

Yutaka, Ichiriyama, Yoji, Kitajima and Manabu, Takahama; Cassette for Conveying Substrate; Patent Abstracts of Japan; Publication No. 2002-064136; Publication Date: Feb. 28, 2002; Japanese Patent Office; Japan.

Seiji, Miyaoka, Keiichi, Endo, Akira, Kageyama, Koji, Ogoshi, Susumu, Kaneko and Yasuo, Katsuya; Electrophotographic Sensitive Body; Patent Abstracts of Japan; Publication No. 05-072786; Publication Date: Mar. 26, 1993; Japanese Patent Office; Japan.

* cited by examiner

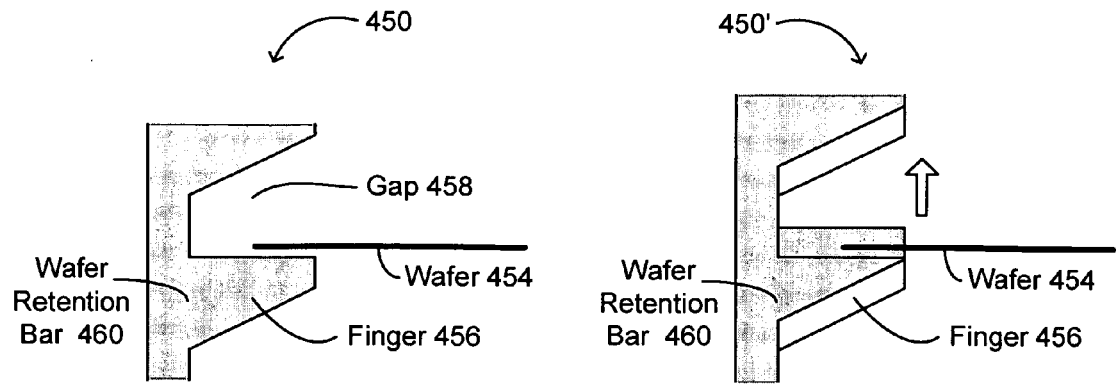
FIG. 7A     FIG. 7B
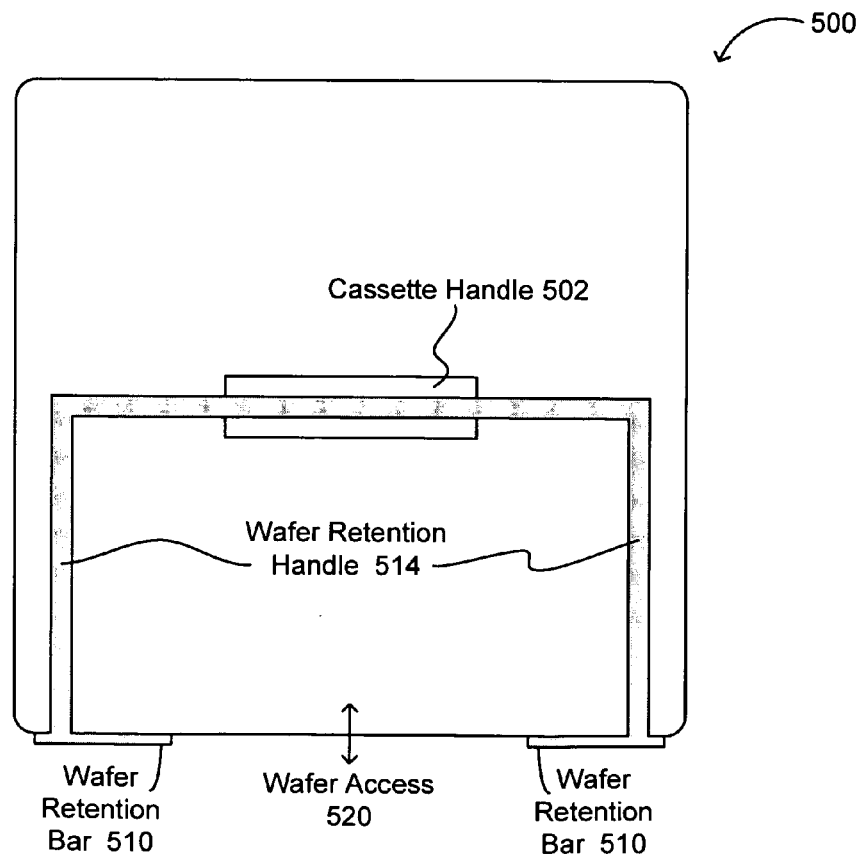
FIG. 8

WAFER CARRYING APPARATUS

This application claims the benefit of the Korean Patent Application No. P2001-64295, filed on Aug. 16, 2004, which is hereby incorporated by reference as if fully set forth herein.

BACKGROUND OF THE INVENTION

1. Field of the Invention

The present invention relates to a wafer carrying apparatus or cassette, and more particularly, a wafer carrying apparatus or cassette which carry wafers in a semiconductor production line and to which a binding or retention unit is fixed, so as to prevent the wafers from inadvertent egress/exit and being subsequently damaged by a crash, and so on. More specifically, embodiments of the present invention pertain to methods and systems for securing wafers in a wafer cassette in order to prevent wafer loss and/or damage.

2. Discussion of the Related Art

Generally, a wafer carrying apparatus (or cassette) is provided with an opening, an insertion hole (e.g., a plurality of grooves), and a grip or handle. The opening is formed on a front surface of the apparatus to take wafers in and out. The insertion hole(s) are formed at an inner side of the apparatus to keep or support the wafers, and the grip is formed on the top of the cassette or carrying apparatus to carry the wafers. However, since the opening is not provided with any safety unit or wafer retaining mechanism, the apparatus is exposed to a risk that the wafers may fall or be ejected from the apparatus by a collision between workers, an inadvertent impact of the apparatus with a piece of equipment, etc., thereby causing a crash.

For example, in many semiconductor manufacturing and/or test operations, semiconductor wafers are accessed from a wafer cassette that can fit within a pod. Referring now to FIG. 1A, a front view diagram showing a conventional wafer cassette is indicated by the general reference character 100. Cassette handle 102 can be used to carry or move wafer cassette 100. Wafers 104 can be accessed by wafer processing equipment from the front side of wafer cassette 100. Each of the wafers 104 can rest on one or more of fingers 106. Each finger 106 can be separated from the others by an air gap 108.

Referring now to FIG. 1B, a front view diagram showing the conventional wafer cassette of FIG. 1A in a conventional pod is indicated by the general reference character 150. Pod 150 is a standardized piece of equipment for loading and unloading a cassette containing a wafer lot (e.g., a group of 24 or 25 wafers) into and out of semiconductor processing equipment, such as an etcher, a plasma deposition apparatus, a photolithography apparatus, cleaning equipment, a tester, etc. While in the pod, wafers 104 cannot be accessed. Wafer cassette 100 must be removed from the pod and then wafers 104 can be accessed from one side of wafer cassette 100. However, wafers 104 are susceptible to either partially or fully falling out of wafer cassette 100 during a transition between pod 150 and manufacturing and/or test equipment. Accordingly, wafers 104 may be damaged by wafer movement in the direction of the open or accessible side of wafer cassette 100.

To solve such a problem, a wafer carrying apparatus has been suggested in the Korean Registered Utility Model No. 121642 as shown in FIG. 2. The apparatus includes insertion holes 209 formed at lower and upper portions in an insertion direction of a side plate 208, binding rings 10 rotatably provided in the insertion holes 209 to be selectively positioned at inner and outer sides of the side plate, a release groove 211 and a control groove 212 formed to communicate with the insertion holes 209, inserting a lower end portion of the binding rings 210, and a spring provided in the upper insertion hole of the insertion holes 209 to upwardly push the binding rings.

However, the aforementioned wafer carrying apparatus has several problems.

Although the apparatus prevents the wafers from being detached or ejected therefrom, the fabricating cost is high because of a complicated structure. Also, to use the apparatus, complicated operations are separately required in such a manner that the binding rings 210 are inserted into the control groove 212 after they are moved to the insertion holes 209 and rotated.

SUMMARY OF THE INVENTION

Accordingly, the present invention is directed to a wafer carrying apparatus (or cassette) that substantially obviates one or more problems due to limitations and disadvantages of the related art.

An object of the present invention is to provide a wafer carrying apparatus in which a means for varying the position of a binding (or wafer retention) unit that opens and closes wafer insertion grooves prevents wafers from being detached, ejected or lost from the apparatus, typically by a simple manipulation of the apparatus when the wafers are being carried.

Another object of the present invention is to provide a wafer carrying apparatus, in which the position of a binding (or wafer retention) unit is varied by simply holding a grip (and, optionally, depressing or otherwise changing a position of a wafer retention mechanism) at an upper portion of the apparatus during transfers of the apparatus, thereby closing wafer insertion or wafer supporting grooves in the apparatus.

Another object of the present invention is to provide a wafer carrying apparatus that has a simple structure to minimize the fabricating cost, and that can be used for existing wafer carrying apparatus without modification of existing wafer processing equipment.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a wafer carrying apparatus according to the present invention includes a main body having a plurality of wafer insertion grooves on inner sides thereof and an opening in a front surface thereof to take wafers in and out, a binding unit configured to move up and down on the front surface of the main body, its position relative to the insertion grooves being variable so as to close and open the insertion holes, and a means for varying the position of the binding unit relative to the insertion grooves, the means for varying being connected to the binding unit.

Preferably, the means for varying the relative position of the binding unit includes a button, and a mechanism that varies the position of the binding unit depending on the position of the button.

Preferably, the wafer carrying apparatus further includes a grip or handle formed on the top of the main body, wherein the button is on the grip or handle.

Preferably, the mechanism includes a connector that connects the button with the binding unit, and a spring configured to maintain the position of the binding unit to open the wafer insertion grooves.

Preferably, the spring keeps the wafer insertion grooves open unless the position of the binding unit is varied to close the wafer insertion grooves while the button is pressed.

Preferably, the binding unit has substantially the same profile as that of side sections of the inner sides of the main body having the insertion grooves.

Preferably, the binding unit has a plurality of trapezoidal projections.

In a further embodiment, a wafer cassette system for securing wafers can include: (i) fingers or protrusions (e.g., the complement of "grooves") for supporting wafers within the cassette; and (ii) a wafer retention unit (or bar) that is substantially aligned with the protrusions in a non-secured or access state, but that is offset from those protrusions in a secured or wafer retention state. The secured state can be entered by deflecting (e.g., pulling or depressing) a wafer retention mechanism (e.g., a handle) that can connect to the wafer retention unit. Once the wafer retention mechanism is released, the wafer cassette system can return to the default access state. Further, the wafer cassette system can be enclosed in or adapted to fit within a standard pod.

In another embodiment, a method for preventing damage to wafers can include the steps of: (i) deflecting a wafer retention mechanism in order to secure the wafers within a wafer cassette or carrying apparatus; and (ii) returning the wafer retention mechanism to a default position, where the wafers are unsecured and/or accessible to automated wafer transporting equipment. The wafer retention mechanism may be grasped along with a wafer cassette handle, for example. Also, removing the cassette or apparatus from and returning it to a pod may be done with the wafer retention mechanism deflected. The wafer retention mechanism may be used to move the wafer retention unit from being substantially aligned with protrusions or fingers supporting the wafers (i.e., the access state) to being offset from the protrusions (i.e., the secured state), for example.

In another embodiment, a method of manufacturing wafers can include the steps of: (i) removing a wafer cassette with the wafer from a first pod or wafer processing apparatus; (ii) transporting the wafer within the wafer cassette having a wafer retention unit thereon; and (iii) placing the wafer cassette in a second pod or wafer processing apparatus. The wafer retention unit can be controlled by a wafer retention mechanism, which may also be grasped along with a wafer cassette handle. Releasing the wafer retention mechanism can allow the wafer(s) in the wafer cassette to be accessed by the processing equipment.

Embodiments of the present invention can advantageously provide a reliable and simplified design approach for preventing wafer damage and/or loss in a semiconductor manufacturing and/or test environment. For example, wafers can be secured within a wafer cassette during critical periods when the cassette must be outside of its pod (e.g., during transportation from one piece of equipment to another). These and other advantages of the present invention will become readily apparent from the detailed description of preferred embodiments below.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 7A is a close-up side view diagram showing a wafer retention unit in a non-secured state according to the alternative embodiment of the present invention;

FIG. 7B is a close-up side view diagram showing the wafer retention bar of FIG. 7A in a secured state;

FIG. 8 is a top view diagram showing a wafer cassette according to the alternative embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
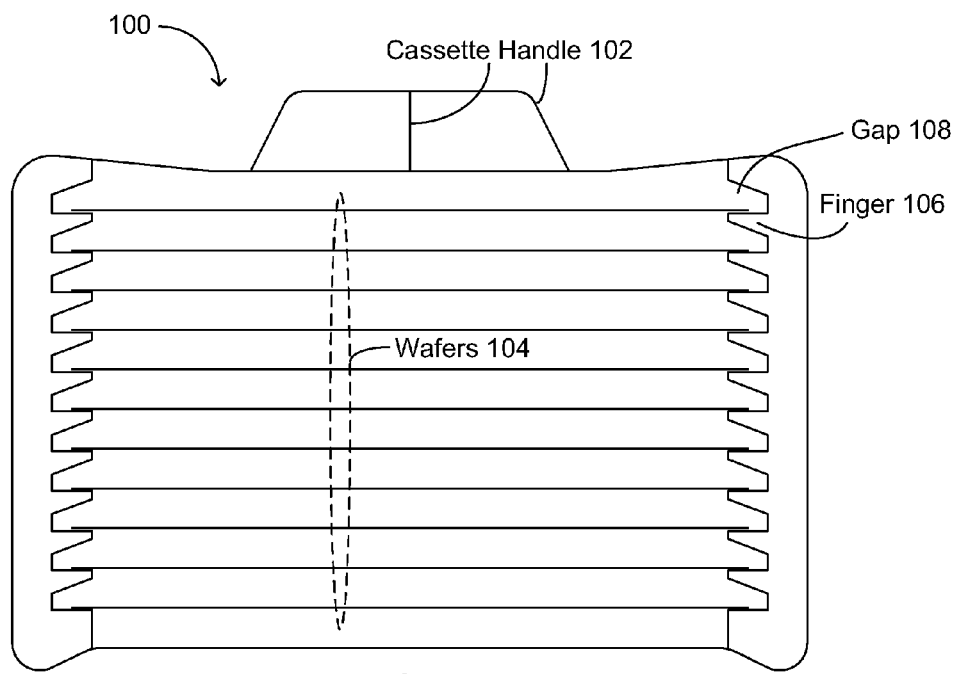
FIG. 1A is a front view diagram showing a conventional wafer cassette.
Figure 1B:
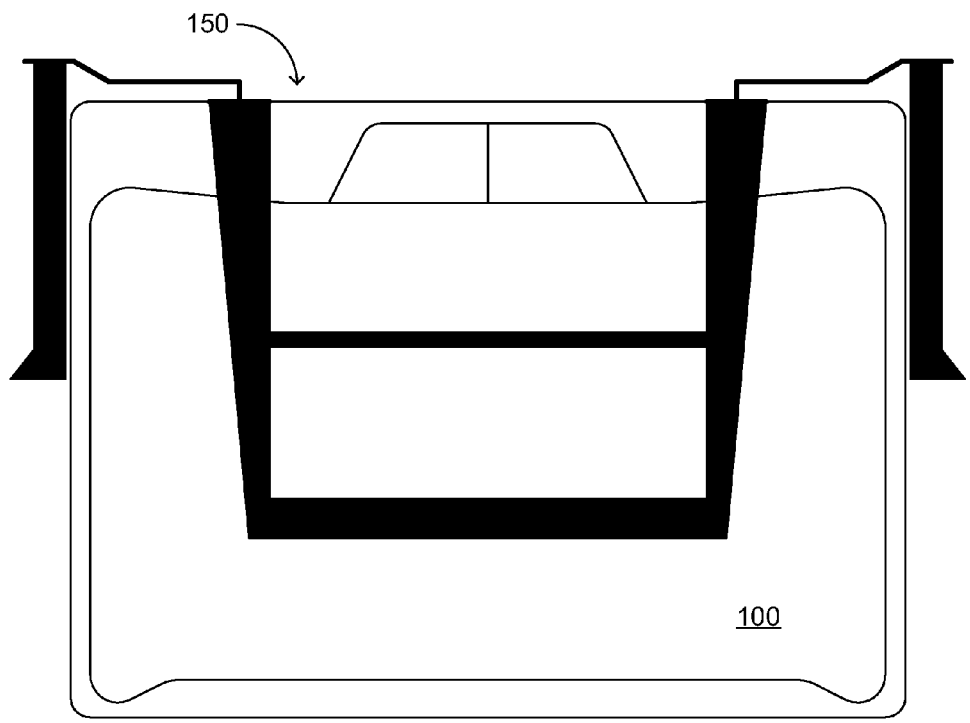
FIG. 1B is a front view diagram showing the conventional wafer cassette of FIG. 1A fitting into a conventional pod.
Figure 2:
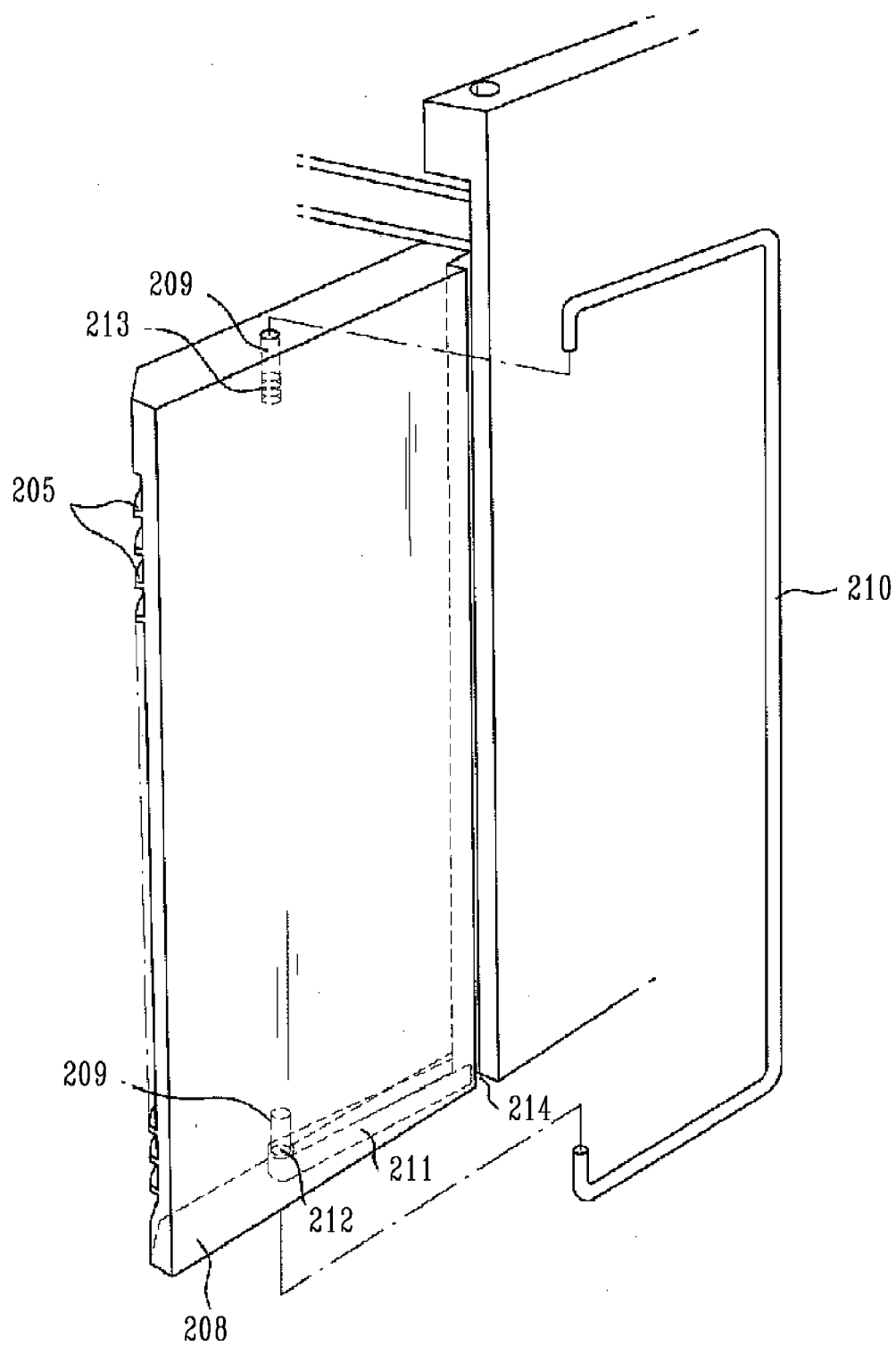
FIG. 2 is an exploded sectional view illustrating a related art wafer carrying apparatus.
Figure 3:
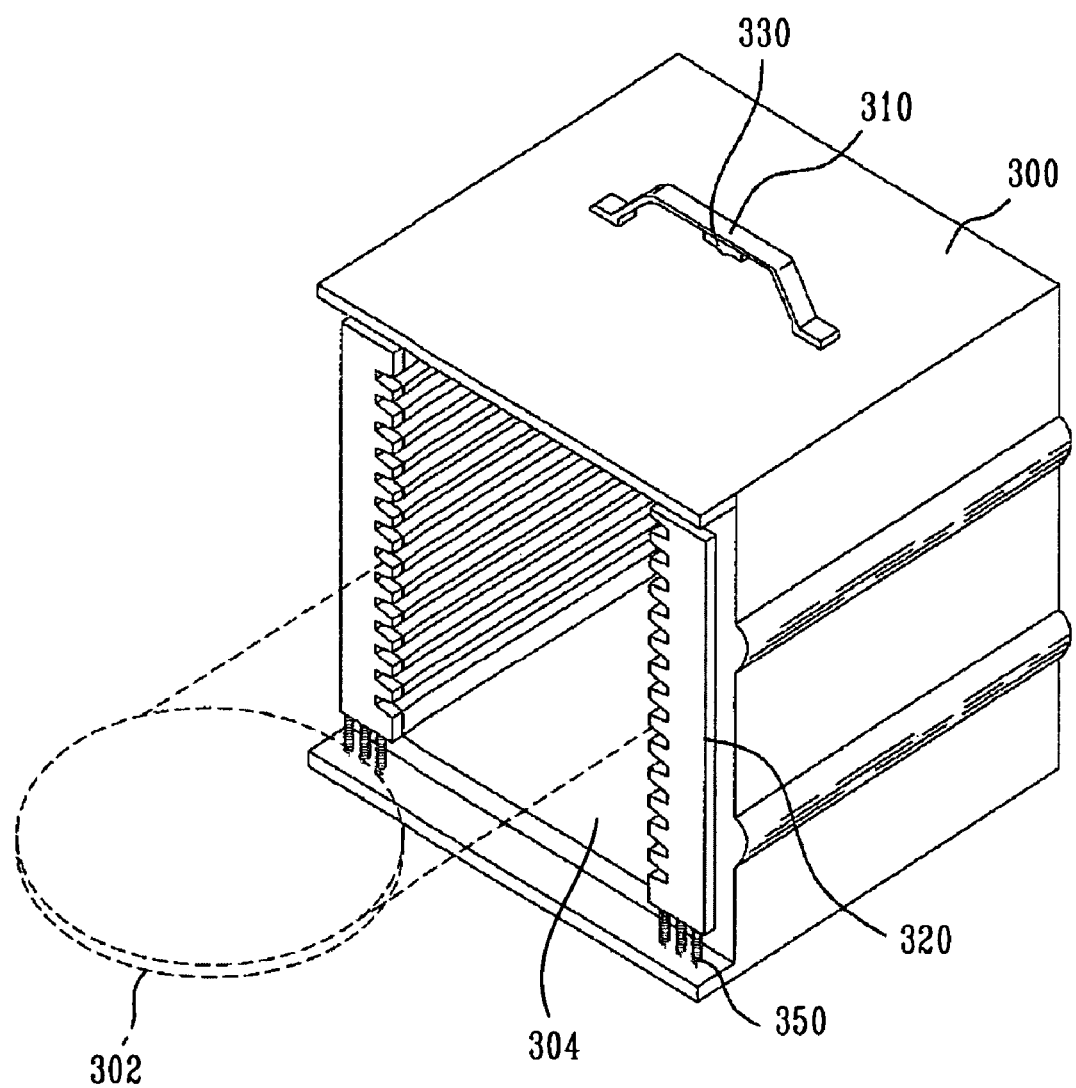
FIG. 3 is a perspective view illustrating a wafer carrying apparatus according to the present invention.

FIG. 3 is a perspective view illustrating a wafer carrying apparatus according to the present invention. Referring to FIG. 3, the apparatus includes a main body 300, a binding unit 320, and a means 330 for varying the position of the binding unit 320. The main body 300 is provided with a plurality of wafer insertion grooves on an inner side thereof and an opening 304 on a front surface thereof, configured to allow wafers to be taken in and out of the apparatus. The binding unit 320 is generally on the front surface of the main body 300, and its position relative to the insertion grooves may be moved or varied so as to close and open the insertion grooves. The means 330 for varying the relative position of the binding unit 320 is connected to the binding unit 320 to vary the position of the binding unit 320 relative to the insertion grooves.

The wafer carrying apparatus according to a preferred embodiment of the present invention may include a button 330, a connector 340 (shown in FIGS. 4-5), and a spring 350, the combination of which may constitute a means for varying the position of binding unit 320. The connector 340 connects the binding unit 320 with the button 330 to vary the position of the binding unit 320, depending on the position or motion of the button 330. In the absence of any force applied to button 330, the spring 350 maintains the position of the binding unit 320 such that the wafer insertion grooves are in an open state.

In this embodiment of the present invention, the spring 350 is positioned on, at or near the bottom of the main body 300, and is connected with the binding unit 320. However, the spring 350 may be positioned on, at or near the top of the main body 300, and there may be one or a plurality of such springs 350 connected to each binding unit 320. Also, a grip or handle 310 may be located at or on an upper portion or surface of the main body 300, and the button 330 may be located or positioned on (e.g., below) the grip 310. The button 330 may be provided on any portion of the grip 310 at user's convenience.

Meanwhile, the binding unit 320 according to this embodiment of the present invention has substantially the same shape or profile as that of side sections of the main body 300 provided with the insertion grooves. In other words, the binding unit 320 includes a plurality of trapezoidal projections 321 (shown in FIGS. 4-5). In addition, the apparatus may comprise a binding unit 320 on both sides, as shown in FIG. 3, or on only one side, but preferably, the apparatus comprises a binding unit 320 on both sides of the apparatus where the wafer insertion grooves are located.

Figure 4:
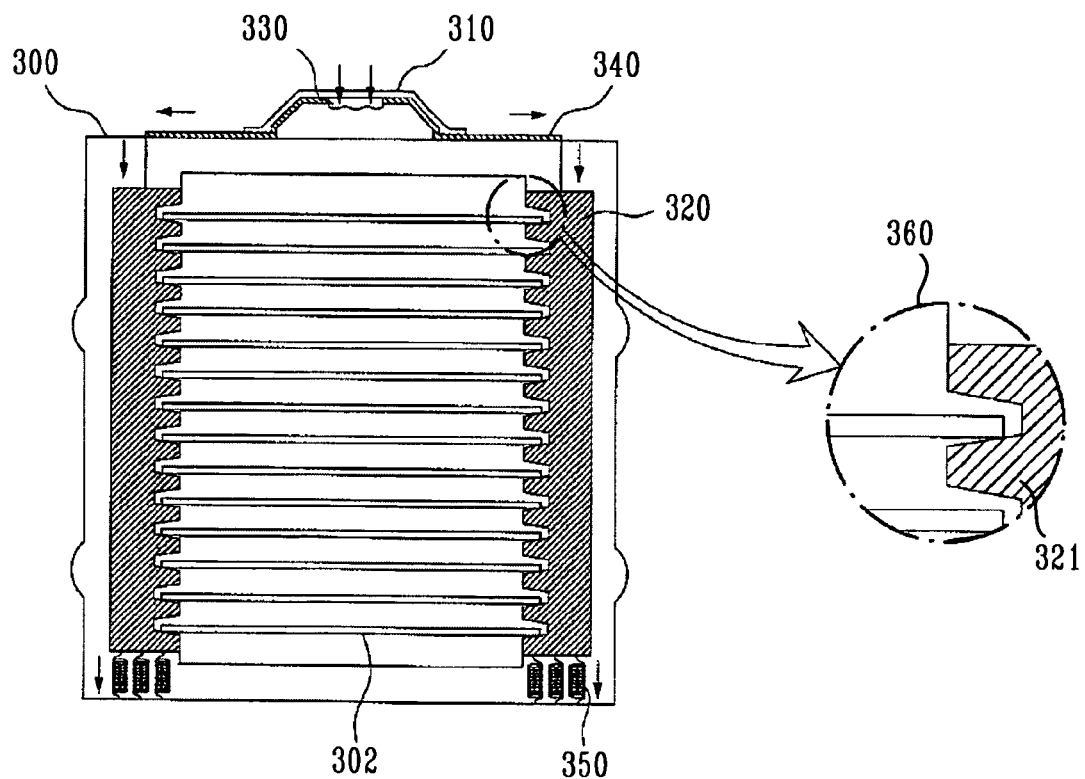
FIG. 4 illustrates the operational state of a wafer carrying apparatus according to the present invention in which the insertion grooves are open.
Figure 5:
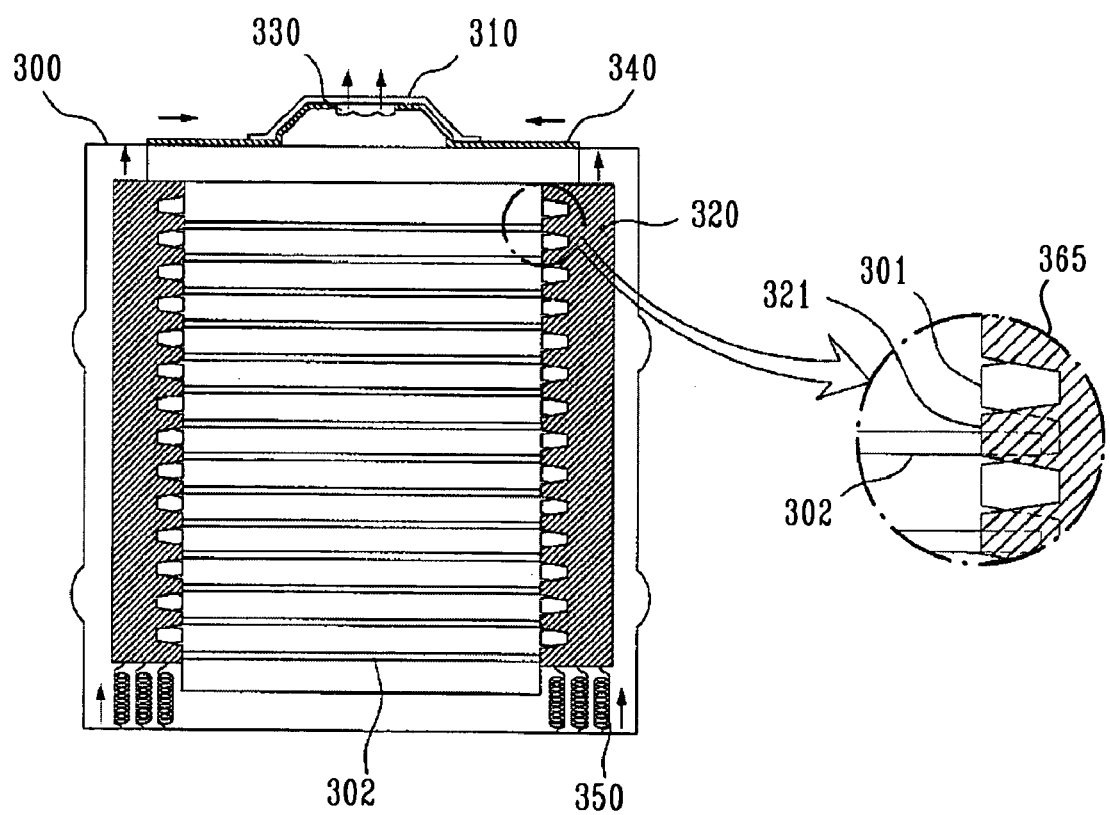
FIG. 5 illustrates the operational state of a wafer carrying apparatus according to the present invention in which the insertion grooves are closed.

FIG. 4 illustrates the operational state of the wafer carrying apparatus according to the present invention in which the insertion grooves are open, and FIG. 5 illustrates the operational state of the wafer carrying apparatus according to the present invention in which the insertion grooves are closed.

Referring to FIG. 4, the binding unit 320 is retained in a relatively low position by the spring 350. Referring to an enlarged portion 360 of FIG. 4, since the projections 321 of the binding unit 320 overlap with peaks 101 of the wafer insertion grooves (which may also be considered as wafer support projections, or fingers, of the wafer carrying apparatus; see FIG. 5), the wafer insertion grooves are maintained in an open state. At this time, wafers 302 can be inserted into or released/taken from the wafer cassette.

Referring to FIG. 5, the wafer carrying apparatus of the present invention is carried by a user who holds the grip 310. The button 330 positioned below the grip 310 is pressed when the user holds the grip 310 and carries the wafer carrying apparatus. While the button 330 is pressed, the binding unit 320 is lifted through the connector 340. To this end, a mechanism is used. Referring to an enlarged portion 365 of FIG. 5, the projections 321 of the binding unit 320 are positioned to cross the thread 301 (e.g., offset from wafer supporting fingers 301 of the wafer cassette) so that the wafer insertion grooves are closed. As a result, the wafers 302 inserted into the wafer insertion grooves are not detached and cannot exit from the wafer carrying apparatus.

If the user releases the grip 310 as the wafer carrying apparatus finishes its carriage and is transported to its destination (e.g., another piece of manufacturing or testing equipment), the binding unit 320 is lowered by the force or elastic power of the spring 350 connected to the binding unit 320. For this reason, the wafer insertion grooves are opened to allow the wafers 302 to be taken in and out.

In another embodiment, the present invention also advantageously provides a reliable and simplified design approach for preventing wafer damage and/or loss in a semiconductor manufacturing and/or test environment. For example, wafers can be secured, within a wafer cassette during critical periods when the cassette must be outside of its pod (e.g., during transportation from one piece of equipment to another). The invention, in its various aspects, will be explained in greater detail below with regard to exemplary embodiments.

Figure 6A:
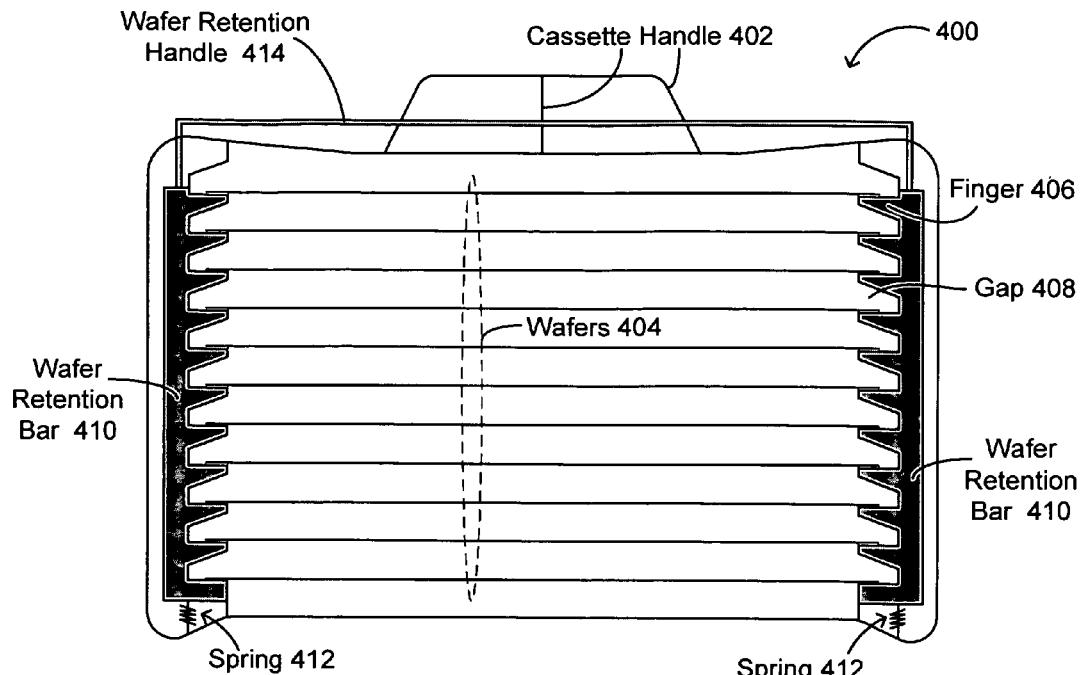
FIG. 6A is a side view diagram showing a wafer cassette in a non-secured state according to an alternative embodiment of the present invention.

Referring now to FIG. 6A, a front view diagram showing a wafer cassette in a non-secured state according to embodiments of the present invention is indicated by the general reference character 400. Cassette handle 502 can be used to carry or move wafer cassette 400. Wafers 404 can be accessed (e.g., by wafer processing equipment) from one side of wafer cassette 400. Each of the wafers 404 can rest on one or more of protrusions or fingers 406. Each finger 406 can be separated from the others by a groove or air gap 408. Wafer retention bar 410 can be attached on the open or accessible side (e.g., the front side) of wafer cassette 400. Spring 412 can be connected to the bottom side of wafer retention bar 410, as shown. Wafer retention mechanism (e.g., handle) 414 can attach to the top side of wafer retention bar 410. Further, wafer retention handle 414 can pass through or otherwise be conveniently accessible by a holder of cassette handle 502. Spring 412 can be a typical spring or any suitable structure that can return wafer retention bar 410 to a position substantially aligned with fingers 406 when there is no deflecting force (e.g., pulling up or pushing down) on the wafer retention mechanism (e.g., handle 414).

In the non-secured state shown in FIG. 6A, wafers 404 can be accessed from the open side containing wafer retention bar 410. For example, when wafer cassette 400 is placed in wafer processing and/or test equipment, wafer retention handle 414 may be released and wafer retention bar 410 can return to a position substantially aligned with fingers 406. Spring 412 can be calibrated so that the return position is substantially aligned with fingers 406 to allow access to wafers 404. Alternatively, spring 412 can be mounted on top of wafer retention bar 410 in other embodiments. Such an alternative embodiment may be used where wafer retention handle 414 may be deflected by being pushed down instead of pulled up for the secure state, as will be discussed in more detail below. In this fashion, embodiments of the present invention can accommodate normal wafer access using conventional wafer processing and/or test equipment. Further, wafer cassette 400 is configured to fit in standard pods for transitions between such equipment and/or test stations.

Figure 6B:
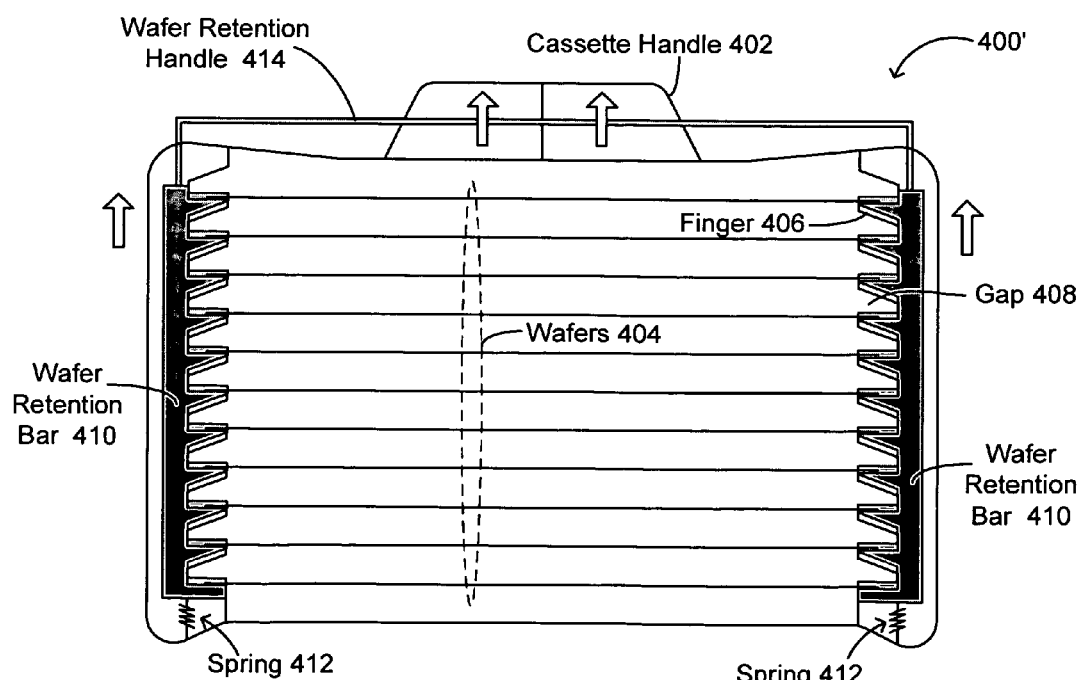
FIG. 6B is a side view diagram showing the wafer cassette of FIG. 6A in a secured state according to the alternative embodiment of the present invention.

Referring now to FIG. 6B, a side view diagram showing the wafer cassette of FIG. 6A in a secured state according to embodiments of the present invention is indicated by the general reference character 400'. When wafer retention handle 414 is deflected (e.g., pulled up by a user or holder of the cassette), wafer retention bar 410 also moves up. This action is indicated by up arrows, as shown in FIG. 6B. Wafer retention bar 410 may then block wafers 404 from being accessed. Further, wafer retention bar 410 can, in this secured state, prevent wafer loss and/or damage in a semiconductor manufacturing and/or test environment. For example, wafers can be secured within the wafer cassette during critical periods when the cassette must be outside of its pod. Such critical periods can include during transportation from one piece of wafer processing and/or test equipment to another.

Referring now to FIG. 7A, a close-up side view diagram showing a wafer retention bar in a non-secured state according to embodiments of the present invention is indicated by the general reference character 450. Wafer 454 rests on a cassette protrusion (denoted as 466 in FIG. 7B) behind wafer retention bar 460. Referring back to FIG. 7A, wafer retention bar 460 generally has fingers 456 substantially aligned with the cassette protrusions in this non-secured or access state. Air gaps 458 generally exist between the cassette protrusions. As one skilled in the art will recognize, the shape of wafer retention bar 460 and/or fingers 456 can vary within the scope of embodiments of the present invention. For example, the edges may be rounded, or rectangle shaped fingers may be used. Further, fingers 456 of wafer retention bar 460 can be integral with wafer retention bar 460 (e.g., as shown), or attached thereto from a discrete piece or section. In accordance with embodiments of the present invention, fingers 456 on wafer retention bar 460 can be substantially aligned with the cassette protrusions so as to allow access to wafer 454 in the non-secured state. Also, the inner surface of fingers 456 can be partially or fully coated (particularly at a location that overlaps with wafer 454 in the secured state) with a shock absorbing material, such as a rubber-like or felt padding, in order to reduce the likelihood of damage and/or particle generation if wafer 454 contacts fingers 456.

Referring now to FIG. 7B, a close-up side view diagram showing the wafer retention bar of FIG. 7A in a secured state according to embodiments of the present invention is indicated by the general reference character 450'. As shown, the wafer retention bar 460 (particularly, a finger thereof) blocks access to wafer 454 in this secured state. As a result, wafer 454 cannot fall out or move to the point of causing substantial damage to wafer 454. As discussed above, fingers on wafer retention bar 460 can be substantially aligned with cassette fingers 456 in the non-secured or access state. Alternatively, the wafer retention bar fingers may not be aligned with protrusions 466, but rather, simply move to block wafer 454 in the secured state. As one skilled in the art will recognize, and referring back to FIG. 7A, such substantial alignment of wafer retention bar fingers 456 to protrusions 466 may not require that the precise shapes of the protrusions 466 and wafer retention bar fingers 456 be the same. Rather, wafer retention bar 460 can be any suitable shape (e.g., a notched rectangle) so as to allow access of wafer 454 in the non-secured state and to prevent access to or egress of wafer 454 in the secured state.

Referring now to FIG. 8, a top view diagram showing a wafer cassette according to embodiments of the present invention is indicated by the general reference character 500. Wafer retention handle 514 may pass through or otherwise be conveniently accessible by a user/holder of cassette handle 502. Accordingly, wafer retention handle 514 may not directly pass through an opening in cassette handle 502, but rather may be routed or located close to cassette handle 502, for example. Further, the shape of wafer retention handle 514 from wafer retention bar 510 may be something other than a corner shape, as shown. For example, a more rounded shape, a loop, and/or more than one wafer retention handle 514 may be used in accordance with embodiments of the present invention. Wafer access 520 can be accommodated when wafer retention handle 514 (or button 330, as shown in FIGS. 3-5) is released, as discussed above.

In another aspect of the invention, a method of manufacturing wafers can include the steps of: (i) removing a wafer cassette with the wafers from a first pod or wafer processing apparatus; (ii) transporting the wafers within the wafer cassette having a wafer retention unit thereon; and (iii) placing the wafer cassette in a second pod or wafer processing apparatus. The wafer retention unit can be controlled by a wafer retention mechanism, which may also be grasped along with a wafer cassette handle. Releasing the wafer retention mechanism can allow the wafer in the wafer cassette to be accessed by the processing equipment.

Figure 9:
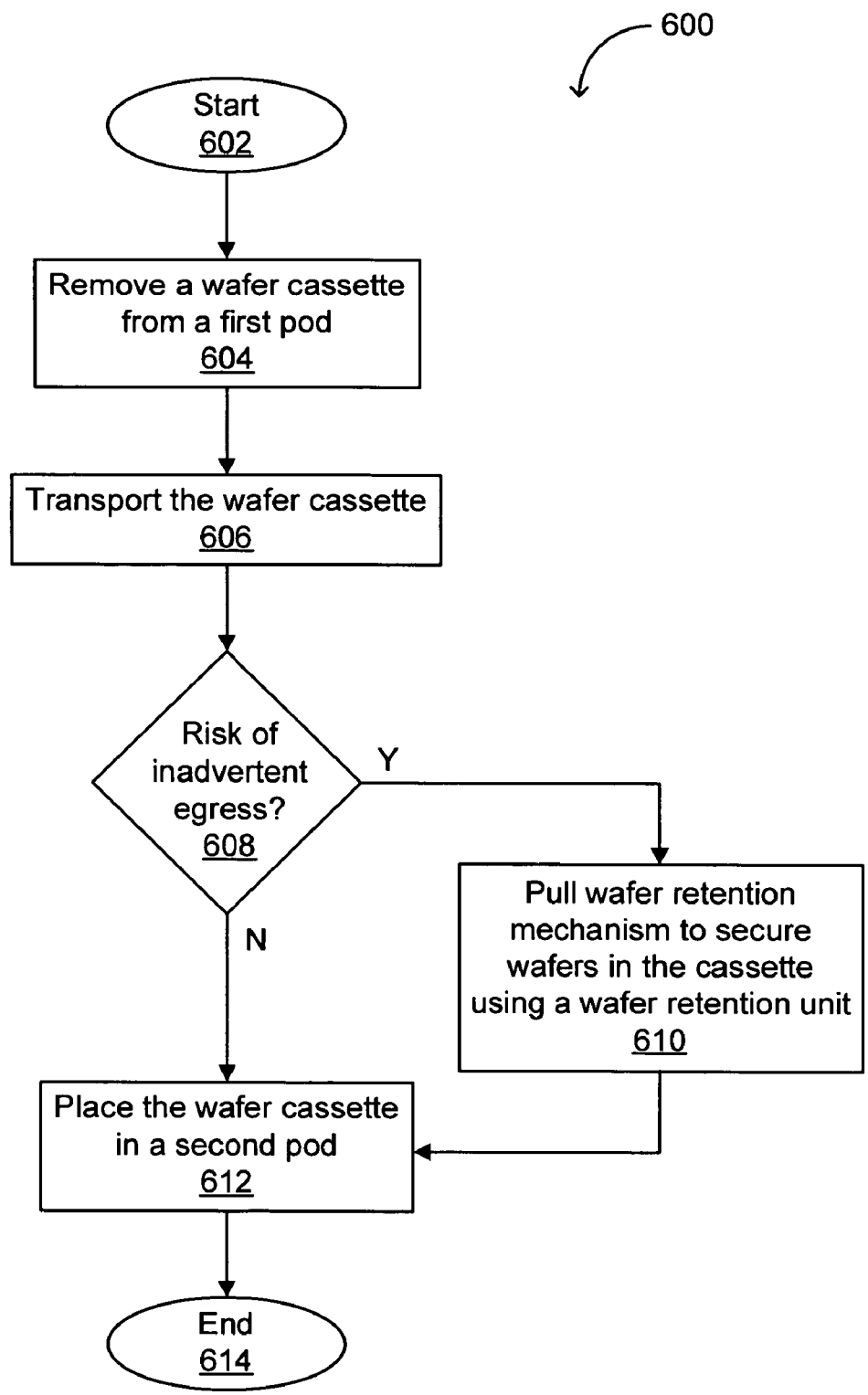
FIG. 9 is an exemplary flow diagram of a method of preventing wafer damage according to various embodiments of the present invention.

Referring now to FIG. 9, an exemplary flow diagram of a method of preventing wafer damage according to embodiments of the present invention is indicated by the general reference character 600. The flow can begin in start 602 and a wafer cassette can be removed from a first pod (604). The pod can be a conventional type of pod suitable for encasing a standard-sized wafer cassette. The wafers can be transported from a location of the first pod (606). When wafers are at risk of inadvertent egress (608) (e.g., when the cassette is accidentally tilted forward, bumped against a relatively immovable object, placed into a pod incorrectly, etc.), usually while transporting the wafers to semiconductor wafer processing equipment or other such critical period, a wafer retention mechanism (e.g., a handle or button) can be deflected (e.g., pulled) to secure wafers using a wafer retention unit (610). The wafer retention mechanism can be grasped along with a wafer cassette handle, for example. Next, the wafer cassette can be returned to the same or a different pod (612) and the flow can complete (614). In this fashion, wafer loss and/or damage can be prevented by securing wafers in their wafer cassette during times away from the associated pod. Once the wafer and/or test equipment no longer needs access to the wafers (e.g., the processing step has completed), the wafer cassette can be removed from the equipment.

As described above, the wafer carrying apparatus according to the present invention has the following advantages.

The wafers can be prevented from falling, exiting or being detached from the wafer carrying apparatus by simple manipulation when the wafers are being carried. For example, the wafer insertion grooves may be closed by holding the grip positioned on the upper portion of the wafer carrying apparatus during movement of the wafer carrying apparatus, thereby preventing the wafers from being detached from or otherwise inadvertently leaving the wafer carrying apparatus.

In addition, since the wafer carrying apparatus has a simple structure, the fabricating cost can be minimized and its structure can be used for standard cassettes or wafer carrying apparatus in standard pods.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A wafer carrying apparatus comprising:
    a main body having a plurality of wafer insertion grooves formed on inner sides thereof and an opening in a front surface thereof adapted to take wafers in and out;
    a binding unit, configured to move up and down on the front surface of the main body, its position relative to the insertion grooves being variable so as to close or open the insertion grooves; and
    a button and a mechanism that varies the position of the binding unit depending on a position of the button.

2. The wafer carrying apparatus according to claim 1, further comprising a grip on top of the main body, wherein the button is on the grip.

3. The wafer carrying apparatus according to claim 1, wherein the mechanism includes a connector that connects the button with the binding unit, and a spring configured to maintain the position of the binding unit.

4. The wafer carrying apparatus according to claim 3, wherein the spring allows the wafer insertion grooves to be open unless the position of the binding unit is varied to close the wafer insertion grooves while the button is pressed.

5. The wafer carrying apparatus according to claim 1, wherein the binding unit substantially has the same profile as that of side sections of the main body provided with the insertion grooves.

6. The wafer carrying apparatus according to claim 1, wherein the binding unit comprises a plurality of trapezoidal projections.

7. The wafer carrying apparatus according to claim 1, wherein the binding unit is on one side of the main body.

8. The wafer carrying apparatus according to claim 1, wherein the binding unit is on one side of the main body.

9. The wafer carrying apparatus according to claim 1, wherein the wafer insertion grooves are partially of fully coated with a shock absorbing material.

10. The wafer carrying apparatus according to claim 3, wherein the spring maintains the position of the binding unit to open the wafer insertion grooves unless the button is pressed, thereby closing the wafer insertion grooves.

11. The wafer carrying apparatus according to claim 3, wherein the spring maintains the position of the binding unit to close the wafer insertion grooves unless the button is pressed, thereby opening the wafer insertion grooves.

12. A wafer cassette system, comprising:
   a plurality of protrusions configured to support a plurality of wafers;
   a wafer retention unit configured to be substantially aligned with said plurality of protrusions in a first state and to be offset from said plurality of protrusions in a second state; and
   a wafer retention handle coupled to said wafer retention unit and configured to control the state of the wafer retention unit, wherein said wafer retention handle is configured to be grasped along with a cassette handle.

13. The wafer cassette system of claim 12, wherein said first state includes a non-secured state for access of said plurality of wafers, and said second state includes a secured state for retention of said plurality of wafers.

14. The wafer cassette system of claim 12, further comprising a spring configured to (i) enable movement of said wafer retention unit when said wafer retention handle is deflected and (ii) return said wafer retention unit to a position substantially aligned with said plurality of protrusions when said wafer retention handle is not deflected.

15. The wafer cassette system of claim 12, wherein said wafer retention handle is configured to be deflected in said second state.

16. The wafer cassette system of claim 12, wherein the protrusions are partially or fully coated with a shock absorbing material.

17. The wafer cassette system of claim 12, further comprising a spring configured to (i) enable movement of said wafer retention unit when said wafer retention handle is deflected and (ii) return said wafer retention unit to a position substantially offset with said plurality of protrusions when said wafer retention handle is not deflected.

18. The wafer cassette system of claim 12, wherein said wafer retention handle is configured to be deflected in said first state.

19. The wafer cassette system of claim 14, wherein said wafer retention handle is configured to be deflected upward.

20. The wafer cassette system of claim 14, wherein said wafer retention handle is configured to be deflected downward.

21. The wafer cassette system of claim 12, wherein the system further comprises the cassette handle.

* * * * *